(12) United States Patent  
van der Gaag et al.

(10) Patent No.: US 9,977,234 B1
(45) Date of Patent: May 22, 2018

(54) ELECTROWETTING DISPLAY PIXEL WALLS AND SPACERS HAVING SURFACE FEATURES

(71) Applicant: Amazon Technologies, Inc., Seattle, WA (US)

(72) Inventors: Jeroen Cornelis van der Gaag, Mierlo (NL); Carlo Klein, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 0 days. days.

(21) Appl. No.: 14/975,002

(22) Filed: Dec. 18, 2015

(51) Int. Cl.
*G02B 26/00* (2006.01)
*G03F 7/00* (2006.01)
*G03F 7/20* (2006.01)
*G03F 7/32* (2006.01)
*G03F 7/38* (2006.01)

(52) U.S. Cl.
CPC ......... *G02B 26/005* (2013.01); *G03F 7/0007* (2013.01); *G03F 7/2002* (2013.01); *G03F 7/32* (2013.01); *G03F 7/38* (2013.01)

(58) Field of Classification Search
USPC ................................................. 359/290–297
See application file for complete search history.

(56) References Cited

U.S. PATENT DOCUMENTS

| | | | | |
|---|---|---|---|---|
| 7,813,030 B2* | 10/2010 | Lo | ......... | G02B 26/005 345/60 |
| 8,885,261 B2* | 11/2014 | Takai | ........ | G02B 3/14 359/619 |
| 8,982,448 B2* | 3/2015 | Hsieh | ...... | G09G 3/348 345/107 |
| 9,348,132 B1* | 5/2016 | Novoselov | ...... | G02B 26/005 |
| 2010/0321760 A1* | 12/2010 | Hayes | ...... | G02B 26/005 359/290 |
| 2014/0293395 A1* | 10/2014 | Hendriks | ...... | G02B 26/005 359/290 |
| 2015/0241689 A1* | 8/2015 | Sakai | ...... | G02B 26/005 359/290 |
| 2016/0379572 A1* | 12/2016 | de Greef | ...... | G09G 3/348 345/694 |

* cited by examiner

*Primary Examiner* — Mohammed Hasan
(74) *Attorney, Agent, or Firm* — Brinks Gilson & Lione

(57) ABSTRACT

A display device includes a first support plate and an opposing second support plate. A wall is formed on the first support plate. A portion of the wall is associated with an electrowetting pixel. A distal end of the wall portion forms a non-planar contact surface having a first surface feature. A spacer is positioned between the second support plate and the wall portion. The spacer has a distal end forming a non-planar contact surface with a second surface feature complementary to the first surface feature. The non-planar contact surface of the spacer contacts the non-planar contact surface of the wall portion.

20 Claims, 11 Drawing Sheets

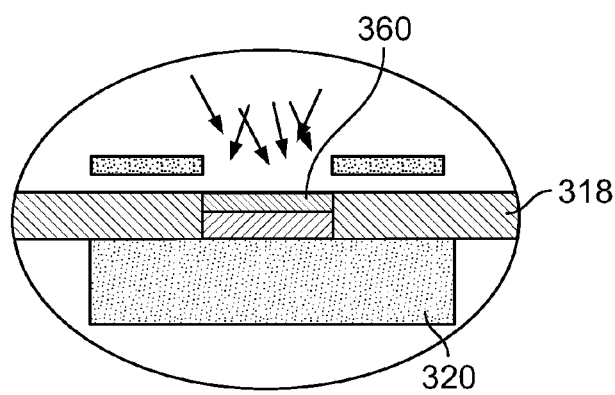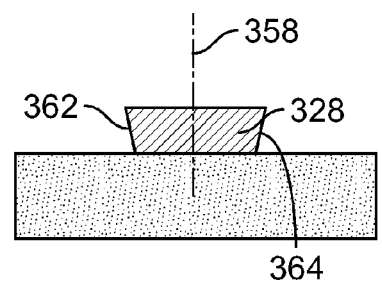
FIG. 19    FIG. 20
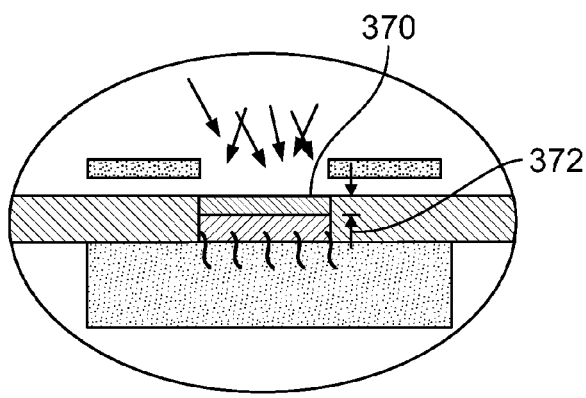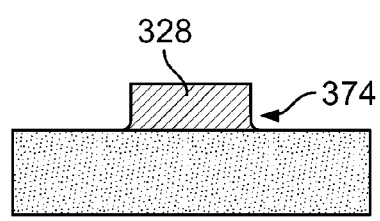
FIG. 21    FIG. 22
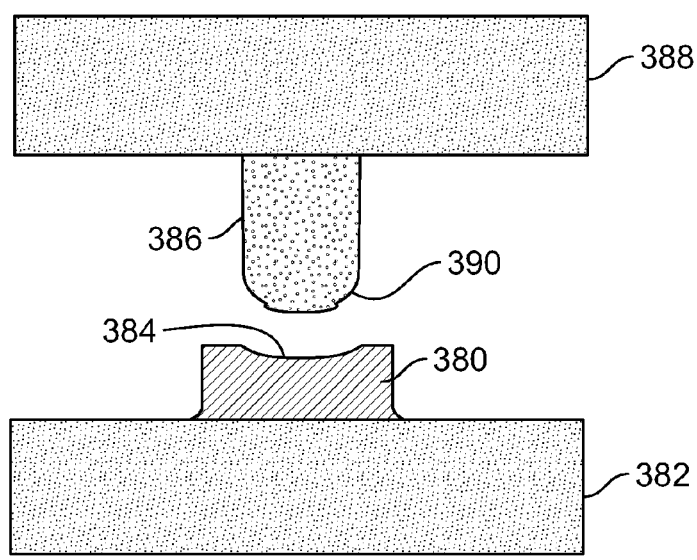
FIG. 23

ELECTROWETTING DISPLAY PIXEL WALLS AND SPACERS HAVING SURFACE FEATURES

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, finding ways to enhance user experience and satisfaction continues to be a priority. Moreover, increased multimedia use imposes high demands on designing, packaging, and fabricating display devices, as content available for mobile use becomes more extensive and device portability continues to be a high priority.

An electrowetting display includes an array of pixels individually bordered by pixel walls that retain fluid, such as an opaque oil, for example. Increased contact between a pixel wall and a respective spacer may maintain or improve performance and mechanical robustness of an electrowetting display panel.

BRIEF DESCRIPTION OF THE DRAWINGS

The detailed description is set forth with reference to the accompanying figures. The use of the same reference numbers in different figures indicates similar or identical items or features.

FIGS. 11-22 shown cross-sectional views of an example electrowetting display device during steps of example fabrication processes, according to various embodiments;

FIG. 23 is a cross-section of a portion of an electrowetting display device showing an example embodiment of a pixel wall having a non-linear contact surface and a spacer having a complementary non-linear contact surface, according to various embodiments.

DETAILED DESCRIPTION

Figure 1A:
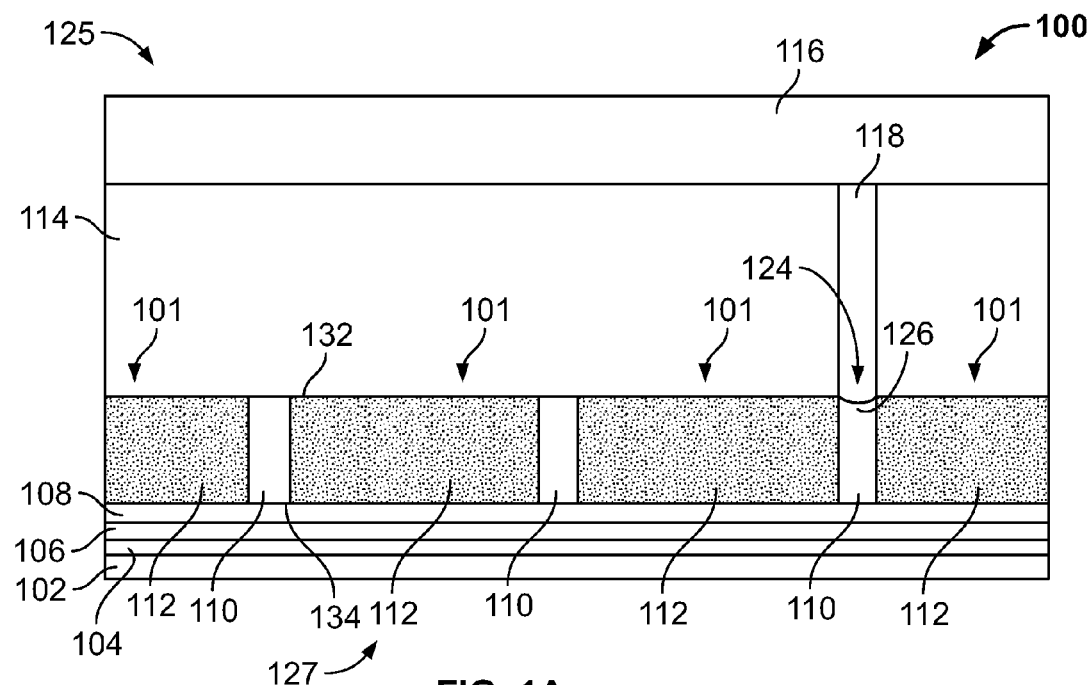
FIG. 1A is a cross-section of a portion of an example electrowetting display device, according to various embodiments.

In various embodiments described herein, electronic devices, e.g., electrowetting display devices, include displays, e.g., electrowetting displays, for presenting content and other information. In some examples, the electrowetting display devices may include one or more components associated with the electrowetting display, such as a touch sensor component layered atop the electrowetting display for detecting touch inputs, a front light or a back light component for lighting the electrowetting display, and/or a cover layer component, which may have antiglare properties, antireflective properties, anti-fingerprint properties, anti-cracking properties, and/or the like. Various embodiments described herein include techniques for assembling electrowetting display devices including these components for the electrowetting displays and other features described herein.

An electrowetting pixel region is defined by a number of pixel walls that surround or are otherwise associated with at least a portion of the electrowetting pixel region. The pixel walls form a structure that is configured to contain at least a portion of a first fluid, e.g., a liquid such as an opaque oil. Light transmission through the electrowetting pixel region can then be controlled by the application of an electric potential to the electrowetting pixel region, which results in a movement of a second fluid, e.g., a liquid such as an electrolyte liquid solution, into the electrowetting pixel region, thereby displacing the first fluid. A pixel region may, unless otherwise specified, include an electrowetting element, one or more pixels, one or more pixels each including a plurality of sub-pixels, or one or more sub-pixels of an electrowetting display device, for example. Such an electrowetting element, pixel or sub-pixel may be the smallest light transmissive, reflective or transflective component of an electrowetting display that is individually operable to directly control an amount of light transmission through and/or reflection from the pixel region. For example, in some implementations, a pixel region may include a plurality of pixels, wherein each pixel includes a red sub-pixel, a green sub-pixel, a blue sub-pixel, and a white sub-pixel. In other implementations, a pixel region may include a plurality of pixels, wherein each pixel is a smallest component of the electrowetting display, i.e., the pixel does not include any sub-pixels.

As disclosed herein, a contact surface of the pixel spacer is shaped to align with a cooperating or complementary contact surface of the pixel wall such that the contact surface of the pixel spacer fits with the contact surface of the pixel wall to increase contact between the contact surfaces of the pixel wall and the pixel spacer to provide a stable and "self-aligning" contact joint at an interface between the pixel spacer and the pixel wall. The stable contact joint provides for improved mechanical strength at the interface and is less sensitive to overflow and/or leakage of the fluid contained within the electrowetting display panel.

The contact surfaces of the pixel wall and the pixel spacer may have various suitable surface features or configurations.

In example embodiments, the pixel wall has a distal end forming a non-planar contact surface having a first predefined surface feature and the spacer has a distal end forming a non-planar contact surface having a second predefined surface feature complementary to the first surface feature. In various embodiments, the first surface feature and the second surface features are predefined such that the resulting pixel wall and spacer have a desired contact surface, e.g., a desired surface configuration and/or profile, to provide an effective contact between the contact surfaces. The contact surface of the spacer contacts the contact surface of the pixel wall to at least partially define an electrowetting pixel region. In these embodiments, the pixel wall and the pixel spacers have complementary non-linear contact surfaces, e.g., at least partially concave, convex, or otherwise curved. For example, in an example embodiment, the pixel wall has a concave contact surface and the pixel spacer has a complementary convex contact surface that follows the contour of the contact surface of the pixel wall. Conversely, in alternative embodiments, the pixel wall has a convex contact surface and the pixel spacer has a cooperating concave contact surface that follows the contour of the contact surface of the pixel wall. In these embodiments, the contact surfaces are symmetrical and have complementary shapes or curvature. In alternative embodiments, the contact surfaces may include other suitable complementary surface features including, without limitation, cooperating slots, channels, tabs, bosses, pegs, holes, openings, voids, or textured surfaces (e.g., to increase friction, or provide varying feature sizes, configurations, and/or sizes), and/or the contact surfaces may themselves be asymmetrical. The stable, self-aligning contact joint facilitates effective contact between the contact surfaces of the pixel wall and the spacer mitigating or preventing overflow effects, in which fluid may flow into neighboring pixel regions, and may further enable an operation of the electrowetting pixel at a higher electric potential, improving overall performance.

An electronic display device, such as an electrowetting display device, may have a transmissive, reflective or transflective display that generally includes an array of pixel regions (e.g., which may comprise pixels and/or sub-pixels) configured to be operated by an active matrix addressing scheme. For example, rows and columns of electrowetting pixel regions are operated by controlling voltage levels on a plurality of source lines and a plurality of gate lines. In this configuration, the electronic display device may produce an image by selecting particular pixel regions to transmit, reflect or block light. Pixel regions are addressed (e.g., selected) via rows of source lines and columns of gate lines that are electrically connected to transistors (e.g., used as switches) included in each pixel region. Transistors take up a relatively small fraction of the area of each pixel region to allow light to efficiently pass through (or reflect from) the pixel region.

Electrowetting displays include an array of pixel regions sandwiched between two support plates, such as a first or bottom support plate and a second or top support plate. For example, a bottom support plate in cooperation with a top support plate may contain pixel regions that include an electrowetting oil, an electrolyte solution, and one or more pixel walls between the support plates. The support plates may be made of a suitable glass, plastic, or other transparent material and may be rigid or flexible, for example. Generally, a material or layer is "transparent" if the material or layer transmits a relatively large fraction of the light incident upon it. For example, a transparent material or layer may transmit more than 70% and, more particularly, more than 80% of the light impinging on its surface, though claimed subject matter is not limited in this respect. The pixel regions include various layers of materials built on or over the bottom support plate. One example layer is an amorphous fluoropolymer (AF) with hydrophobic behavior, around portions of which pixel walls are built.

Hereinafter, example embodiments include, but are not limited to, reflective electrowetting displays that include a clear or transparent top support plate and a bottom support plate, which need not be transparent, e.g., made of an opaque material. The transparent top support plate may be glass or any suitable transparent material, such as a transparent plastic, quartz, or semiconductor material, for example, and claimed subject matter is not limited in this respect. The terms "top" and "bottom" are generally used to identify the opposing support plates of an electrowetting display device, and do not necessarily refer to a direction referenced to gravity or to a viewing side of the electrowetting display device. Also, for the sake of convenience of describing example embodiments, the top support plate is the surface through which the pixel regions of a (reflective) electrowetting display are viewed.

In certain embodiments, individual reflective electrowetting pixels include a reflective layer on the bottom support plate of the electrowetting pixel region, a transparent electrode layer adjacent to the reflective layer, and a hydrophobic layer on the electrode layer. The pixel walls of each pixel, the hydrophobic layer, and the transparent top support plate at least partially enclose a fluid region or cavity. Within the fluid region, a first fluid that is electrically non-conductive, e.g., an opaque oil, is retained in the individual electrowetting pixels by the pixel walls. A second fluid overlies the first fluid and the pixel walls of the patterned pixel region grid. In certain embodiments, the second fluid is an electrolyte liquid that is electrically conductive or polar and may be a water or a salt solution, such as a solution of potassium chloride in water. The second fluid may be transparent, or may be colored or light-absorbing. The second fluid is immiscible with the first fluid. In general, substances are immiscible with one another if the substances do not substantially form a solution, although in a particular embodiment the second fluid might not be perfectly immiscible with the first fluid. In general, an "opaque" fluid is a fluid that appears black to an observer. For example, an opaque fluid strongly absorbs a broad spectrum of wavelengths (e.g., including those of red, green and blue light) in the visible region of electromagnetic radiation appearing black. However, in certain embodiments, an opaque fluid may absorb a relatively narrower spectrum of wavelengths in the visible region of electromagnetic radiation and may not appear perfectly black.

In some embodiments, the opaque fluid is a nonpolar electrowetting oil. In certain embodiments, the first fluid may absorb at least a portion of the visible light spectrum. The first fluid may be transmissive for a portion of the visible light spectrum, forming a color filter. For this purpose, the first fluid may be colored by addition of pigment particles or a dye. Alternatively, the first fluid may be black, for example by absorbing substantially all portions of the visible light spectrum, or reflecting. A reflective first fluid may reflect the entire visible light spectrum, making the layer appear white, or a portion of the entire visible light spectrum, making the layer have a color. In example embodiments, the first fluid is black and, therefore, absorbs substantially all portions of an optical light spectrum, for example, in the visible light spectrum. The opaque fluid is disposed in the fluid region. A coverage area of the opaque first fluid on the bottom hydrophobic layer is electrically adjustable to affect the amount of light incident on the reflective electrowetting display that reaches the reflective material at the bottom of each pixel.

One or more spacers and one or more edge seals may also be located between the two support plates to at least partially enclose the fluid region. The spacers and the edge seals mechanically couple the first support plate with the opposing, overlying second support plate, and form a separation between the first support plate and the second support plate, as well as contribute to the mechanical integrity of the electrowetting display device. In example embodiments, the edge seals are disposed along a periphery of an array of electrowetting pixels, to facilitate retaining fluids (e.g., the first fluid and the second fluid) between the first support plate and the second support plate. The spacers can be at least partially transparent so as to not hinder throughput of light in the electrowetting display. The transparency of the spacers may at least partially depend on the refractive index of the spacer material, which in certain embodiments is similar to or the same as the refractive indices of surrounding media. The spacers may also be chemically inert to surrounding media.

In some embodiments, an electrowetting display as described herein may form a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a lightguide of the display device. For example, display software may include code executable by a processor to modulate optical properties of individual pixel regions of the electrowetting display based, at least in part, on electronic signals representative of static image and/or video data. The code may cause the processor to modulate the optical properties of pixel regions by controlling electrical signals (e.g., voltages, currents, and fields) on, over, and/or in layers of the electrowetting display.

Figure 1B:
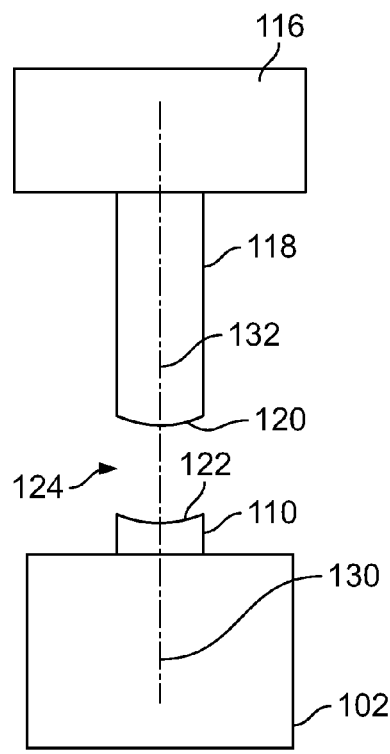
FIG. 1B is an exploded view of a portion of the example electrowetting display device shown in FIG. 1A.
Figure 2A:
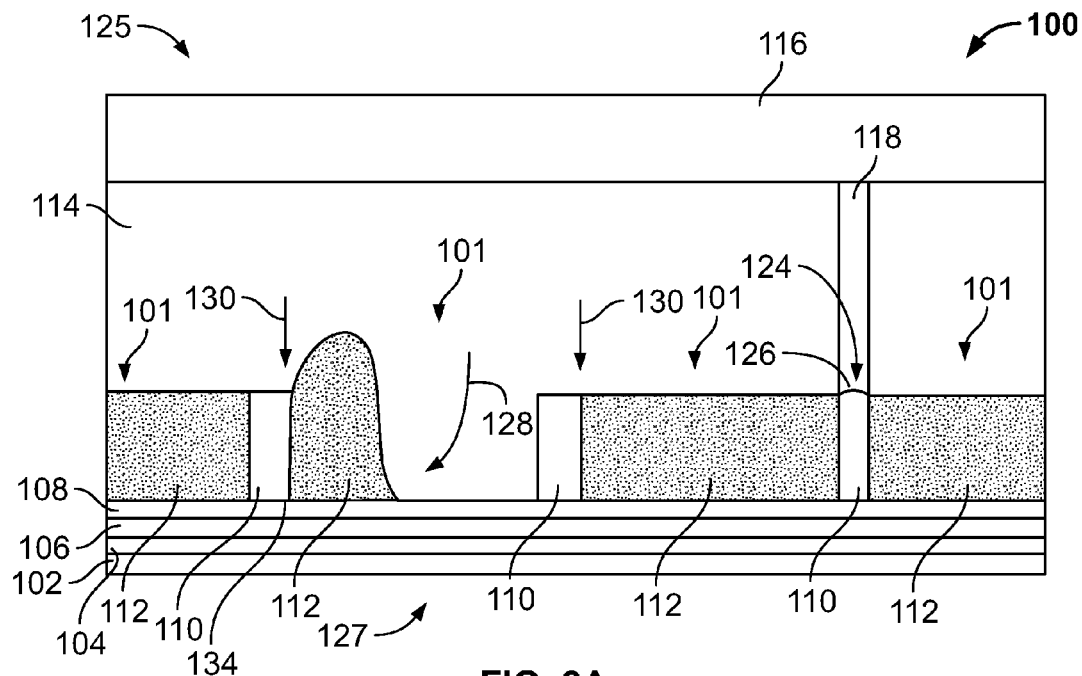
FIG. 2A is a cross-section of a portion of an example electrowetting display device, according to various embodiments.
Figure 2B:
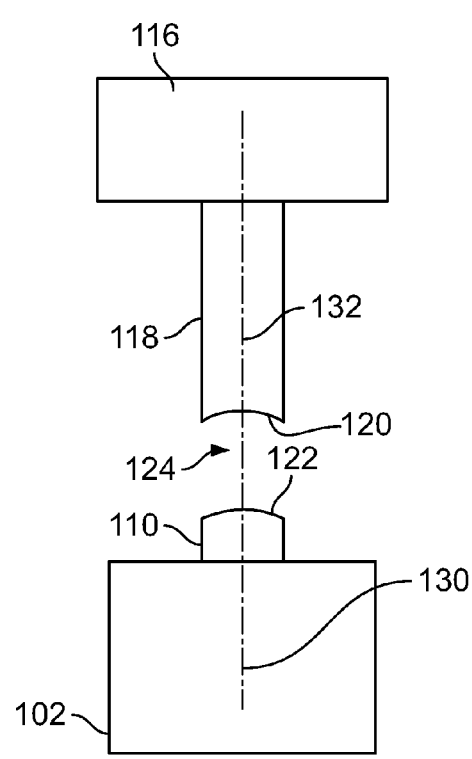
FIG. 2B is an exploded view of a portion of the example electrowetting display device shown in FIG. 2A.
Figure 3:
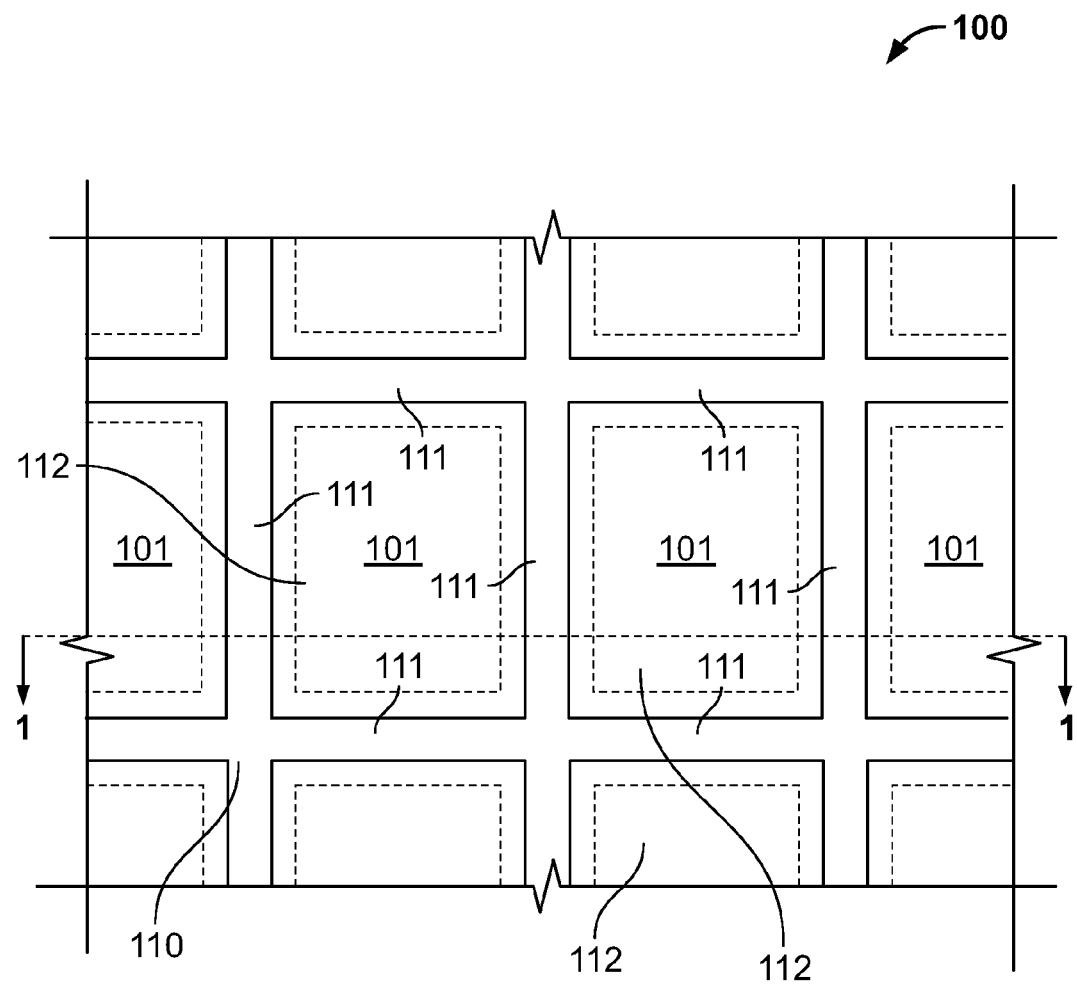
FIG. 3 is a top view of the electrowetting pixel regions of FIGS. 1A and 2A mostly exposed by an electrowetting fluid, according to various embodiments.

FIG. 1A is a cross-section of a portion of a reflective electrowetting display device 100 showing a pixel region having several electrowetting pixels 101 taken along sectional line 1-1 of FIG. 3. FIG. 1B is an exploded view of a portion of the example electrowetting display device shown in FIG. 1A. FIG. 2A shows a cross-sectional view of a portion of a reflective electrowetting display device 100 in which an electric potential has been applied to one of the electrowetting pixels 101 causing displacement of a first fluid disposed therein, as described below. FIG. 2B is an exploded view of a portion of the example electrowetting display device shown in FIG. 2A. FIG. 3 shows a top view of the pixel region including electrowetting pixels 101 formed over or on a first or bottom support plate 102. In certain embodiments, one or more components or layers may be positioned between bottom support plate 102 and the plurality of electrowetting pixels 101.

In FIGS. 1A and 2A, two complete electrowetting pixels 101 and two partial electrowetting pixels 101 are shown. Electrowetting display device 100 may include any number (usually a very large number, such as thousands or millions) of electrowetting pixels 101. An electrode layer 104 is formed on bottom support plate 102.

In various embodiments, electrode layer 104 may be connected to any number of transistors, such as thin film transistors (TFTs) (not shown), that are switched to either select or deselect electrowetting pixels 101 using active matrix addressing, for example. A TFT is a particular type of field-effect transistor that includes thin films of an active semiconductor layer as well as a dielectric layer and metallic contacts over a supporting (but non-conducting) substrate, which may be glass or any of a number of other suitable transparent or non-transparent materials, for example.

In some embodiments, a dielectric barrier layer 106 may at least partially separate electrode layer 104 from a hydrophobic layer 108, such as an amorphous fluoropolymer layer for example, also formed on bottom support plate 102. Such separation may, among other things, prevent electrolysis occurring through hydrophobic layer 108. Barrier layer 106 may be formed from various materials including one or more organic layers or a combination of one or more organic layers and one or more inorganic layers. In some embodiments, hydrophobic layer 108 is an amorphous fluoropolymer layer including any suitable fluoropolymer(s), such as AF1600, produced by DuPont, based in Wilmington, Del. Hydrophobic layer 108 may also include suitable materials that affect wettability of an adjacent material, for example.

A plurality of pixel walls 110 form a patterned electrowetting pixel grid on hydrophobic layer 108. In an example embodiment, pixel walls 110 are formed of a photoresist material such as, for example, epoxy-based negative photoresist SU-8. The patterned electrowetting pixel grid includes rows and columns that form an array of electrowetting pixels 101. More specifically, as shown in FIG. 3, in the example embodiments, one or more pixel wall portions 111 at least partially form a perimeter of a respective electrowetting pixel 101. For example, an electrowetting pixel 101 may have a width and a length in a range of about 50 to 500 micrometers in certain embodiments.

A first fluid 112, which may have a thickness (e.g., a depth) in a range of about 1 to 10 micrometers, for example, overlays hydrophobic layer 108. First fluid 112 is partitioned by pixel walls 110 of the patterned electrowetting pixel grid. A second fluid 114, such as an electrolyte solution, overlays first fluid 112 and pixel walls 110 of the patterned electrowetting pixel grid. Second fluid 114 may be electrically conductive and/or polar. For example, in one embodiment second fluid 114 is a water solution or a salt solution such as potassium chloride water. As described above, second fluid 114 is immiscible with first fluid 112 in example embodiments.

A second or top support plate 116 covers second fluid 114 and one or more spacers 118 to maintain second fluid 114 over the electrowetting pixel region array. In one embodiment, spacer 118 is positioned between top support plate 116 and pixel wall 110. In the example embodiments, spacer 118 is coupled to and extends from top support plate 116 to contact a contact surface formed on a first or distal end of a corresponding pixel wall 110, as described in greater detail below. In certain embodiments, one or more components or layers may be positioned between top support plate 116 and spacers 118. In this arrangement, a contact surface 120 of spacer 118 contacts a contact surface 122 of corresponding pixel wall 110 to provide a stable and "self-aligning" contact joint at an interface 124 between pixel wall 110 and spacer 118, as shown for example in FIGS. 4-9, providing mechanical strength at interface 124 that is less sensitive to overflow and/or leakage of first fluid 112 and/or second fluid 114 contained within pixels 101. In example embodiments, multiple spacers 118 are interspersed throughout the array of pixels 101. Top support plate 116 may be made of glass or polymer and may be rigid or flexible, for example. In some embodiments, TFTs are fabricated onto support plate 116. A voltage applied across, among other things, second fluid 114 and electrode layer 104 of individual electrowetting pixels may control transmittance or reflectance of the individual electrowetting pixels.

Electrowetting display device 100 has a viewing side 125 on which an image formed by electrowetting display device 100 may be viewed, and an opposing rear side 127. Top support plate 116 faces viewing side 125 and bottom support plate 102 faces rear side 127. Electrowetting display device 100 may be a segmented display type in which the image is built of segments. The segments may be switched simultaneously or separately. Each segment includes one electrowetting pixel 101 or a number of electrowetting pixels 101 that may be neighboring or distant from one another. Electrowetting pixels 101 included in one segment are switched simultaneously, for example. Electrowetting display device 100 may also be an active matrix driven display type or a passive matrix driven display, for example.

Hydrophobic layer 108 is arranged over bottom support plate 102 to create an electrowetting surface area. The hydrophobic character of hydrophobic layer 108 causes first fluid 112 to adjoin preferentially to hydrophobic layer 108 because first fluid 112 has a higher wettability with respect to the surface of hydrophobic layer 108 than second fluid 114 in the absence of a voltage. Wettability relates to the relative affinity of a fluid for the surface of a solid. Wettability increases with increasing affinity, and it may be measured by a contact angle formed between the fluid and the solid and measured internal to the fluid of interest. For example, such a contact angle may increase from relative non-wettability of more than 90° to complete wettability at 0°, in which case the fluid tends to form a film on the surface of the solid.

First fluid 112 absorbs light within at least a portion of the optical spectrum. First fluid 112 may be transmissive for light within a portion of the optical spectrum, forming a color filter. For this purpose, the fluid may be colored by addition of pigment particles or dye, for example. Alternatively, first fluid 112 may be black (e.g., absorbing substantially all light within the optical spectrum) or reflecting. Hydrophobic layer 108 may be transparent-. A reflective layer below the hydrophobic layer may reflect light within the entire visible spectrum, making the layer appear white, or reflect a portion of light within the visible spectrum, making the layer have a color.

In example embodiments, pixel wall 110 is formed over bottom support plate 102, e.g., on hydrophobic layer 108. A distal end of pixel wall 110, e.g., pixel wall portion 111, forms contact surface 122 having a first surface feature, as described herein. Spacer 118 is positioned between top support plate 116 and pixel wall 110. Spacer 118 has a distal end forming contact surface 120 having a second surface feature complementary to the first surface feature such that contact surface 120 contacts contact surface 122, as shown for example in FIGS. 1B and 2B.

Referring to FIGS. 1B and 2B, contact surface 120 of spacer 118 contacts contact surface 122 of corresponding pixel wall 110 at interface 124 forming a contact joint 126 shown in FIGS. 1A and 2A. As shown in FIGS. 1B and 2B, contact surface 120 is complementary to, i.e., follows the contour of contact surface 122, such that contact surface 120 substantially contacts contact surface 122. More specifically, substantially all of contact surface 120 contacts contact surface 122 so that no gap is formed between spacer 118 and pixel wall 110. For example, in an example embodiment as shown in FIGS. 1A and 1B, contact surface 120 of spacer 118 has a concave contour and contact surface 122 of pixel wall 110 has a complementary convex contour for receiving contact surface 120 of spacer 118. In an example alternative embodiment, as shown in FIGS. 2A and 2B, contact surface 120 of spacer 118 has a convex contour and contacted surface 122 of pixel wall 110 has a complementary concave contour for receiving contact surface 120 of spacer 118. In these embodiments, contact surface 120 and contact surface 122 are generally curvilinear and are formed of smooth curved surfaces. Further, contact surface 120 follows the contour of contact surface 122, such that substantially all of contact surface 120 contacts contact surface 122 so that no gap is formed between spacer 118 and pixel wall 110.

Figure 4:
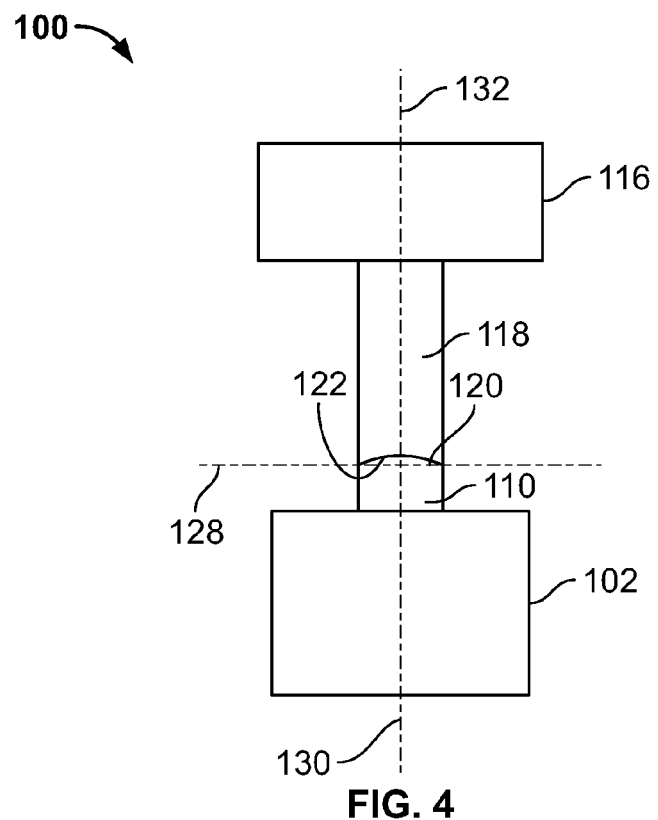
FIG. 4 is a cross-section of a portion of an electrowetting display device showing a pixel wall having a non-linear contact surface and a spacer having a complementary non-linear contact surface, according to various embodiments.
Figure 5:
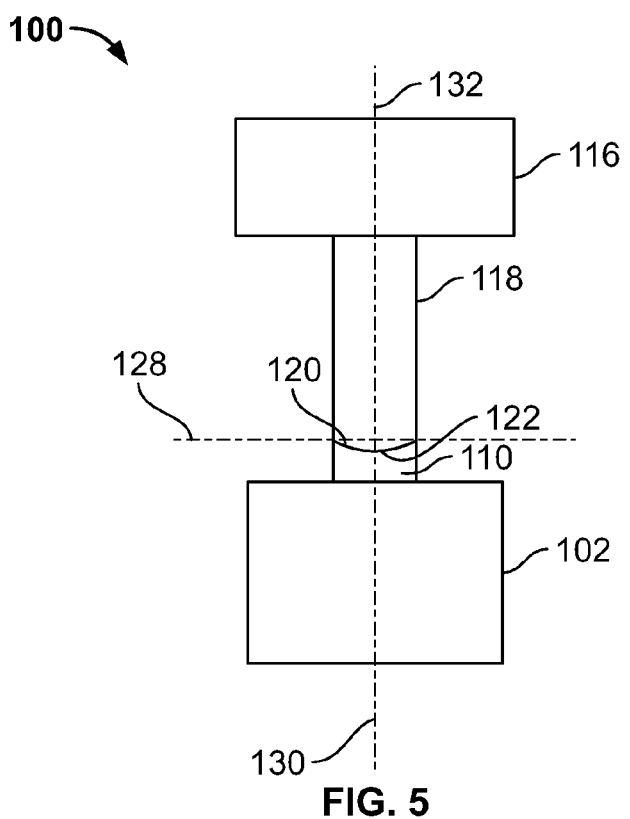
FIG. 5 is a cross-section of a portion of an electrowetting display device showing a pixel wall having a non-linear contact surface and a spacer having a complementary non-linear contact surface, according to various embodiments.
Figure 6:
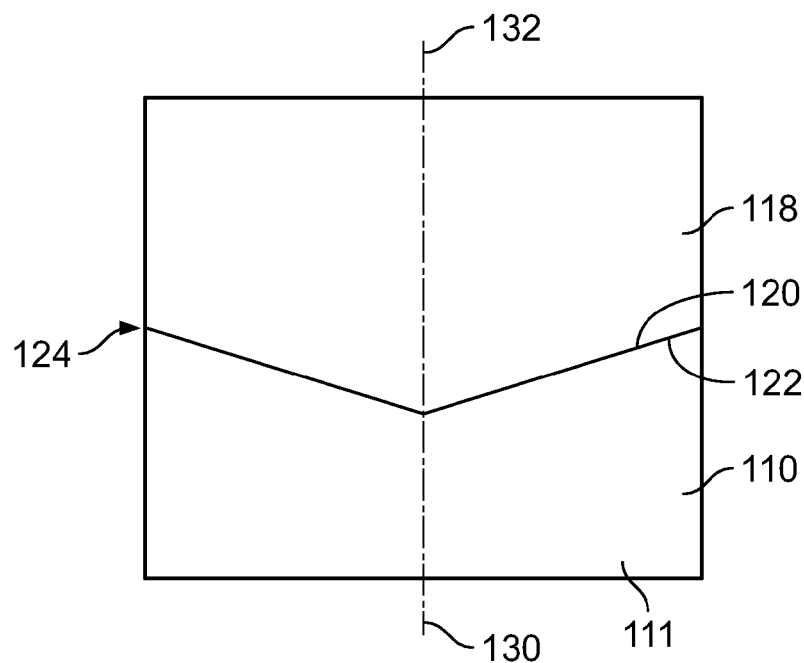
FIGS. 6-9 is a cross-section of a portion of an electrowetting display device showing example alternative embodiments of a pixel wall having a non-linear contact surface and a spacer having a complementary non-linear contact surface, according to various embodiments.
Figure 7:
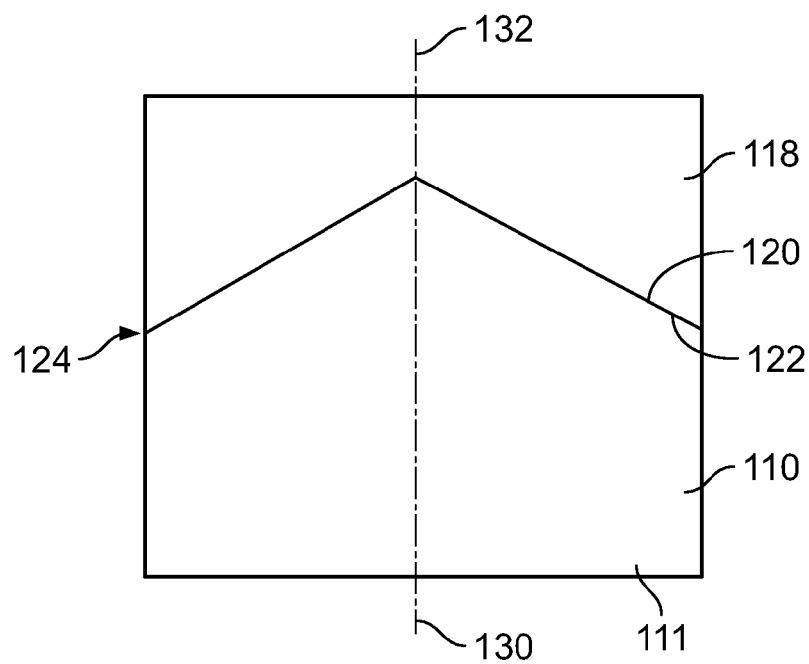

Referring further to FIG. 4, in certain embodiments, the first surface feature provides a concave contact surface 122 of pixel wall 110 and the second surface feature provides a convex contact surface 120 of spacer 118. In a particular embodiment, the first surface feature is concave with respect to a plane 128 extending along a width of the wall perpendicular to a longitudinal centerline 130 of pixel wall 110 and the second surface feature is convex with respect to plane 128 extending along a width of spacer 118 perpendicular to a longitudinal centerline 132 of spacer 118. In the example embodiments, longitudinal centerline 130 is coaxially aligned with longitudinal centerline 132 of spacer 118 such that plane 128 is also perpendicular to both longitudinal centerlines 130, 132. With longitudinal centerline 132 coaxially aligned with longitudinal centerline 130, contact between concave contact surface 122 and convex contact surface 120 is optimized to provide an improved contact joint 126 at interface 124. In example alternative embodiment, as shown in FIG. 5, the first surface feature provides a convex contact surface 122 of pixel wall 110 and the second surface feature provides a concave contact surface 120 of spacer 118. In this embodiment, the first surface feature is convex with respect to plane 128 and the second surface feature is concave with respect to plane 128. In another embodiment, a portion of contact surface 122 of pixel wall 110 is planar and a complementary portion of contact surface 120 of spacer 118 is planar.

In other embodiments, at least a portion of contact surface 122 of pixel wall 110 is arcuate and a complementary portion of contact surface 120 of spacer 118 is arcuate, as described, for example, with respect to FIGS. 4 and 5.

In one embodiment, the curvature of contact surface 120 and the curvature of contact surface 122 are selected so that contact surface 120 and contact surface 122 represent a 15-30 degree arc, though other curvatures may be utilized in accordance with the present disclosure. For example, in certain embodiments, the curvature is selected so that contact surface 120 and contact surface 122 each represents an arc of 5 degrees to 30 degrees. Further, in certain embodiments, the curvature is not constant and/or different pixel walls 110 and spacers 118 may have different curvatures. Moreover, in example embodiments, a width of pixel wall 110 is substantially equal to a width of spacer 118. In these embodiments, the width of pixel wall 110 and the width of spacer 118 is less than 5 micrometers and, more particularly, between 1 and 2 micrometers. In alternative embodiments, the width of pixel wall 110 and/or the width of spacer 118 may not be uniform. For example, in certain embodiments a distal end of pixel wall 118 forming contact surface 122 and/or a complementary distal end of spacer 118 forming contact surface 120 may have a different width, e.g., a greater width, than a width at a base end of the respective pixel wall 110 or spacer 118. It is noted that slight variations in these dimensions and other dimensions presented in the present disclosure are considered to be within workable examples of the present pixel wall and spacer design. In this embodiment, the width of pixel wall 110 is approximately that of a conventional rectangular pixel wall 110. In certain embodiments, the height of pixel walls 110 is 1 micrometer to 6 micrometers, and, in particular embodiments, the height of pixel walls 110 is 2 micrometers to 3.5 micrometers.

If a voltage is applied across an electrowetting pixel 101, electrowetting pixel 101 will enter into an active state. Electrostatic forces will move second fluid 114 toward electrode layer 104 as hydrophobic layer 108 formed within the active electrowetting pixel 101 becomes hydrophilic, thereby displacing first fluid 112 from that area of hydrophobic layer 108 to pixel walls 110 surrounding the area of hydrophobic layer 108, to a droplet-like form. Such displacing action uncovers first fluid 112 from the surface of hydrophobic layer 108 of electrowetting pixel 101.

FIG. 2A shows one electrowetting pixels 101 in an active state. With an electric potential applied to electrode layer 104 underneath the activated electrowetting pixel 101, second fluid 114 is attracted towards electrode layer 104 displacing first fluid 112 within the activated electrowetting pixel 101. As second fluid 114 moves into the activated electrowetting pixel 101 (as illustrated by arrows 128), first fluid 112 is displaced and moves toward pixel wall 110. First fluid 112 forms into a droplet against pixel wall 110.

Of potentially additional benefit, because substantially all of contact surface 120 contacts contact surface 122 of corresponding pixel wall 110 at interface 124 so that no gap is formed between spacer 118 and pixel wall 110, when constructing electrowetting display device 100 incorporating electrowetting pixels 101, it may be easier to position top support plate 116 so that spacers 118 are correctly seated on the corresponding pixel wall 110. In effect, spacer 118 is self-aligning during the construction process such that spacer 118 can be precisely positioned over a center of pixel wall 110, e.g., longitudinal centerline 132 of spacer 118 can be coaxially aligned with longitudinal centerline 130 of corresponding pixel wall 118. Further, because essentially no gap is formed between contact surface 120 and contact surface 122 during the construction process, the first fluid 112 can be more effectively constrained within each electrowetting pixel 101 during use of electrowetting display device 100. As a result, electrowetting pixels 101 can be activated using higher voltages than conventional electrowetting pixels, without causing overflow. By using higher voltages in electrowetting pixel 101, the movement of first fluid 112 within electrowetting pixel 101 can be better controlled, leading to a larger grayscale range for electrowetting pixel 101.

After activation, when the voltage across electrowetting pixel 101 is returned to an inactive signal level of zero or a value near to zero, electrowetting pixel 101 will return to an inactive state, where first fluid 112 flows back to cover hydrophobic layer 108. In this way, first fluid 112 forms an electrically controllable optical switch in each electrowetting pixel 101.

FIGS. 1 and 2 shown example alternative embodiments of pixel walls 110 and spacers 118 having complementary convex and concave surfaces. In other embodiments, however, contact surface 120 and contact surface 122 have any suitable complementary shapes and/or surfaces such that when spacer 118 is position on respective pixel wall 110, substantially no gap is formed at interface 124. The example pixel wall and spacer configurations shown in FIGS. 1 and 2 show symmetrical pixel walls 110 having contact surfaces 122 and symmetrical spacers 118 having contact surfaces 120 similarly shaped about a plane oriented perpendicular to a length of pixel walls 110 and spacers 118. In various other embodiments, however, non-symmetrical pixel walls may be fabricated in accordance with the present disclosure.

In the present disclosure, a number of different pixel wall and spacer surface features having non-planar contact surfaces are described. It should be understood that due to various manufacturing process limitations, when fabricated, the contact surfaces of pixel walls 110 and spacers 118 may not be perfectly smooth. Instead, the contact surfaces may include a number of steps or edges that are a result of limitations in the fabrication process.

For example, FIGS. 6-9 show suitable, alternative example pixel wall and spacer surface features. FIGS. 6-9 show only the distal portion of pixel wall 110 and the distal portion of spacer 118. Additional elements of electrowetting display device 100, such as bottom support plate 102, top support plate 116, electrode layer 106, hydrophobic layer 108, first fluid 112 and second fluid 114 are not shown so as to simplify the figures. As shown in FIGS. 6-9, the distal end of pixel wall 110 forms non-planar contact surface 122 having a first predefined surface feature and the distal end of spacer 118 forms non-planar contact surface 120 having a second predefined surface feature complementary to the first surface feature such that contact surface 120 of spacer 118 contacts contact surface 122 of pixel wall 110 at interface 124 to at least partially define an electrowetting pixel 101.

Referring to FIGS. 6-9, in certain embodiments, contact surface 120 may include a plurality of planar regions or portions that contact complementary planar regions or portions of contact surface 122. The planar regions need not be radially aligned or symmetrical and may be radially asymmetrical, non-radially symmetrical, or may vary across the electrowetting display device 100, i.e., a first area of electrowetting display device 100 may include a first contact surface 120 and a first complementary contact surface 122 and a second area of electrowetting display device 100 may include a second contact surface 120 and a second complementary contact surface 122, different from the first contact surfaces.

Figure 8:
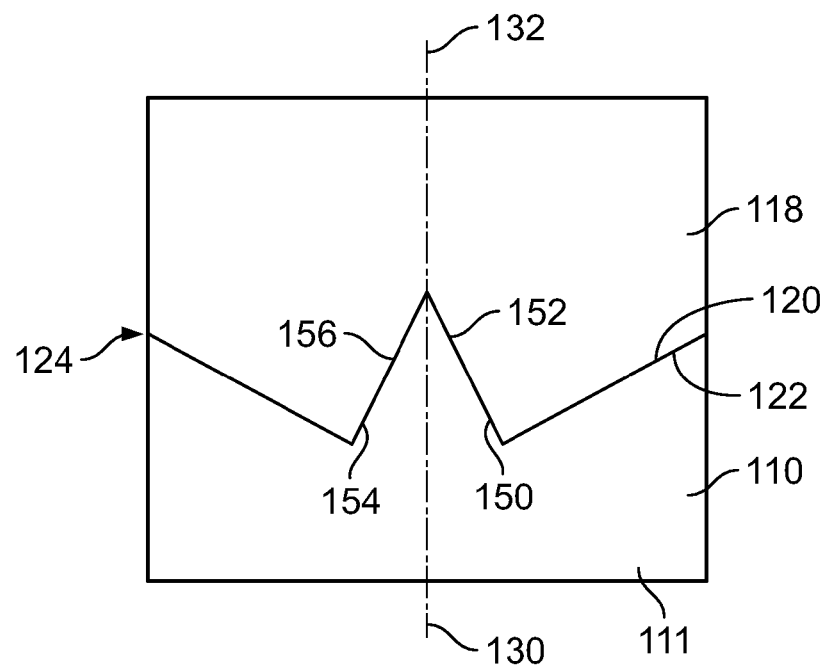
Figure 9:
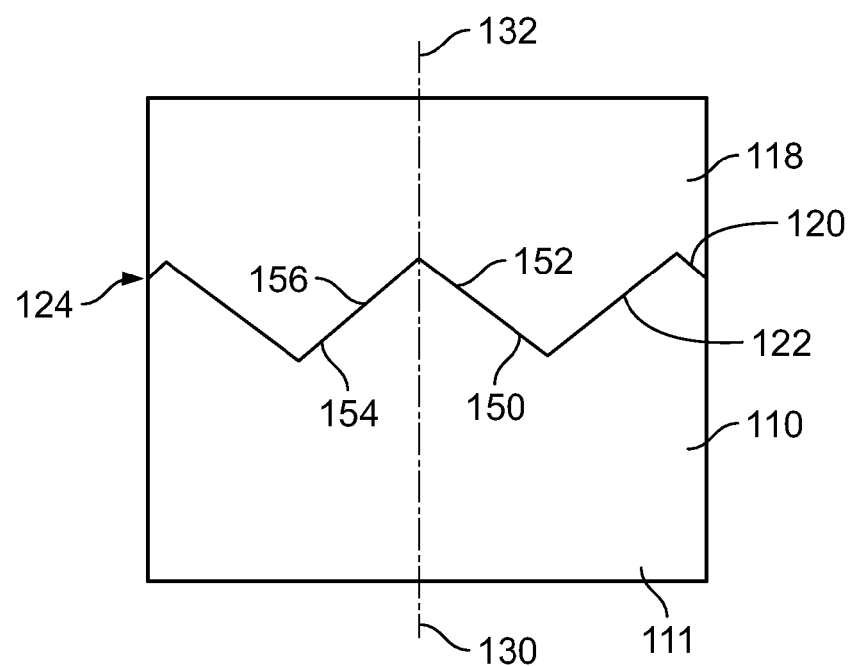

For example, as shown in FIGS. 8 and 9, contact surface 122 may include a first planar region 150 and contact surface 120 may include a second planar region 152 complementary to first planar region 150, e.g., aligned with and substantially contacting first planar region 150 along an axis perpendicular to longitudinal axes 130, 132. Similarly, contact surface 122 may include a third planar region 154 and contact surface 120 may include a fourth planar region 156 complementary to third planar region 154, e.g., aligned with and substantially contacting third planar region 154 along an axis perpendicular to longitudinal axes 130, 132. In one embodiment, the first surface feature includes first planar region 150 at an acute angle or an obtuse angle with respect to longitudinal centerline 130 of pixel wall portion 111 and the second surface feature includes complementary second planar region 152 substantially contacting first planar region 150. In a particular embodiment, the first surface feature also includes third planar region 154, with first planar region 150 and third planar region 154 meeting at longitudinal axis 130 of pixel wall portion 111. The second surface feature includes fourth planar region 156, with second planar region 152 and fourth planar region 156 meeting at longitudinal axis 132 of spacer 118 coaxial with longitudinal axis 130. Third planar region 154 may be at an acute angle or an obtuse angle with respect to longitudinal centerline 130 of pixel wall portion 111 or, in alternative embodiments, may be at a right angle with respect to longitudinal centerline 130.

In alternative embodiments, contact surface 120 may include one or more projections, e.g., tabs, bosses, or pegs, and contact surface 122 may include suitable cooperating voids, holes, channels, or slots to accept projections on contact surface 120 to align spacer 118 with pixel wall 110 to provide a stable contact joint 126. Alternatively or in addition, contact surface 122 may include one or more projections, e.g., tabs, bosses, or pegs, and contact surface 120 may include suitable cooperating voids, holes, channels, or slots to accept projections on contact surface 122 to align spacer 118 with pixel wall 110 to provide a stable contact joint 126.

The non-planar contact surfaces of the pixel walls and the spacers in the present disclosure may be formed using any suitable fabrication process. In one embodiment, during fabrication of the electrowetting display device, lithography employing diffractive grayscale masks can be utilized to form the curved contact surfaces of the pixel walls and the spacers.

Figure 10:
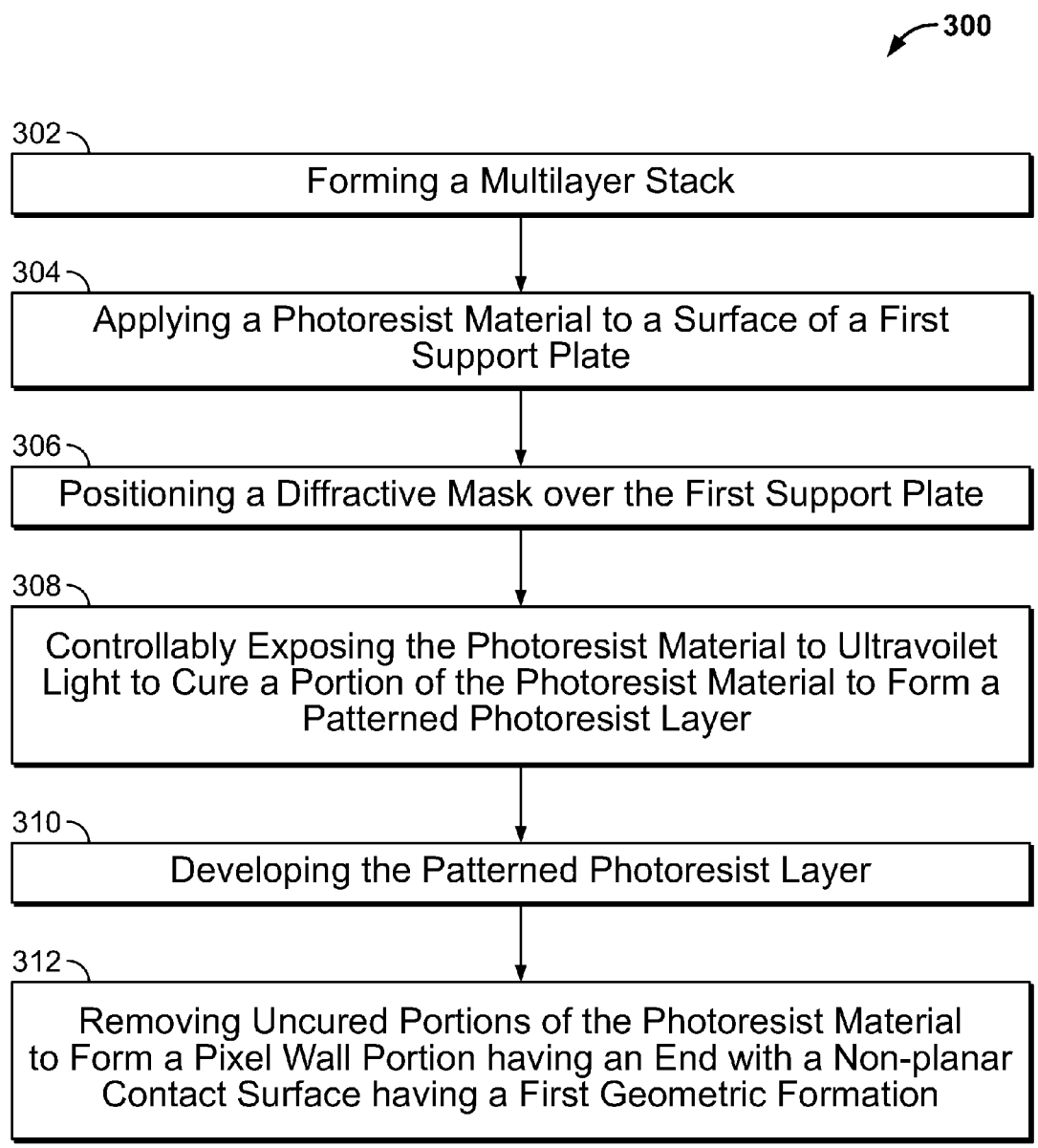
FIG. 10 is a flow diagram of an example process for fabricating an electrowetting display device, according to various embodiments.

FIG. 10 is a flow diagram of a method 300 for fabricating an electrowetting display device, according to various embodiments. For example, the electrowetting display device may employ a pixel wall and spacer configuration such as that shown in FIGS. 1 and 2. Though claimed subject matter is not limited in this respect, method 300 may be performed manually (e.g., by humans) and/or using automated equipment. At block 302, a multilayer stack is first formed. In certain embodiments, the multilayer stack includes a first conductive layer deposited on a first support plate. In one embodiment, the first conductive layer is indium tin oxide (ITO), although in alternative embodiments the first conductive layer may be another suitable material. Deposition techniques include, for example, chemical vapor deposition (CVD), physical vapor deposition (PVD), molecular beam epitaxy (MBE), and sputtering. The first support plate may be the same as or similar to bottom support plate 102 shown in FIG. 1A.

The multilayer stack includes a first dielectric layer deposited on the first conductive layer. The first dielectric layer may comprise SiN, SiON, SiO, or TaO, for example. Any suitable deposition technique may be used, such as CVD, PVD, MBE, and a sputtering, for example. A hydrophobic layer (e.g., hydrophobic layer 108, shown in FIG. 1A) may be deposited over the patterned first dielectric layer.

At block 304, a photoresist material is applied over a surface of a first support plate. In one embodiment, a photoresist material is deposited on a surface of a first support plate, e.g., on the multilayer stack, or on the hydrophobic layer. In certain embodiments, the photoresist material is an epoxy-based negative photoresist SU-8, although other suitable photoresist materials may be used in alternative embodiments. A diffractive mask is positioned 306 over the first support plate. The diffractive mask includes a pattern of non-transparent material defining one or more openings through the diffractive mask. The one or more openings allow ultraviolet light to pass through the one or more openings to impinge on the photoresist material. The photoresist material is then controllably exposed 308 to ultraviolet light using the diffractive mask to cure a portion of the photoresist material to form a patterned photoresist layer. The patterned photoresist layer is developed 310 and uncured portions of the photoresist material are removed 312 to form a pixel wall portion having an end with a non-planar contact surface having a first surface feature. In various embodiments, the process may include one or more positive and/or negative photoresist processing steps.

Figure 11:
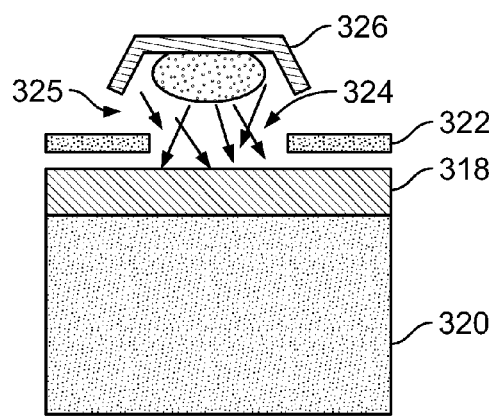
Figure 12:
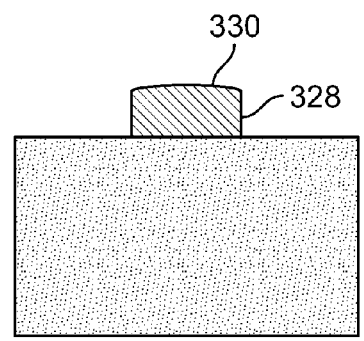

FIGS. 11 and 12 are partial cross-sectional views of a portion of an electrowetting display device that shows these fabrication steps in more detail. Referring additionally to FIGS. 11 and 12, a photoresist material 318 is deposited over a first support plate 320, e.g., on the multilayer stack or the hydrophobic layer. A diffractive mask 322 is positioned over first support plate 320. As shown in FIG. 11, diffractive mask 322 includes a pattern of non-transparent material defining one or more openings 324 through diffractive mask 322. Openings 324 allow ultraviolet light 325 emitted from an ultraviolet light source 326 to pass through openings 324. At block 308, photoresist material 318 is controllably patterned through diffractive mask 322 to cure a portion of the photoresist material to form a patterned photoresist layer. During this process step, various process variables and/or parameters can be adjusted to control patterning of the photoresist material to form the components as desired. During performance of block 308, the one or more portions of the photoresist material not covered or protected by diffractive mask 322 are exposed to ultraviolet light 325 causing molecules within at least a portion of the exposed photoresist material to at least partially cross-link as the photoresist material is cured to form the patterned photoresist layer. In certain embodiments, the photoresist material is controllably patterned using a diffractive mask having slits or openings through which a layer of the photoreist material is exposed to ultraviolet light. Alternatively, a grey tone mask with a chromium layer on glass that can be varied in thickness from place to place as desired or a phase-shift mask, i.e., a dark/light field mask can be used to pattern the photoresist material to form pixel walls, as well as other structures or components.

The patterned photoresist layer is then developed 310 and the uncured portions of the photoresist material, e.g., unexposed residual photoresist material, are removed 312 to form a pixel wall 328, as shown in FIG. 12, having a distal end with a non-planar contact surface 330 having a first surface feature. In alternative embodiments, these structures may be printed using suitable methods other than photolithography, including, without limitation, direct writing and electron beam lithography (EBL).

Although not shown in FIGS. 11 and 12, a spacer having a distal end forming a non-planar contact surface having a second surface feature complementary to the first surface feature can be similarly formed. To form the spacer, a photoresist material is deposited over a surface of a second support plate. A diffractive mask is positioned over the second support plate. The diffractive mask includes a pattern of non-transparent material defining one or more openings through the diffractive mask. The one or more openings allow ultraviolet light to pass through the one or more openings. The photoresist material is controllably pattered through the diffractive mask to cure a portion of the photoresist material to form a patterned photoresist layer. The patterned photoresist layer is developed to form a spacer having a distal end with a non-planar contact surface having a second surface feature complementary to the first surface feature.

After forming a plurality of pixel walls each having a distal end with a non-planar contact surface having a first surface feature formed on the first support plate and a plurality of spacers having a distal end with a non-planar contact surface having a second surface feature complementary to the first surface feature formed on the second support plate, the distal end of each spacer is aligned to contact the distal end of a corresponding pixel wall to at least partially define an electrowetting pixel region and the second support plate is coupled to the first support plate.

In one embodiment, before aligning the distal end of the spacer to contact the distal end of the pixel wall, the first support plate having a plurality of pixel walls formed thereon is unwound from a first roll with each of the plurality of pixel walls having the first surface feature. Similarly, the second support plate having a plurality of spacers formed thereon is unwound from a cooperating second roll with each of the plurality of spacers having the second surface feature complementary to the first surface feature. In this embodiment, the first support plate having a plurality of pixel walls formed thereon can be wound on the first roll and the second support plate having a plurality of spacers formed thereon can be wound on the cooperating second roll of a suitable manufacturing machine using conventional methods and apparatus, for example.

As described above, the photoresist material is controllably patterned by ultraviolet light passing through the diffractive mask to cure a portion of the photoresist material to form the patterned photoresist layer. During the process of controllably patterning the photoresist material, a surface feature forming the contact surface at the distal end of the pixel wall and/or a surface feature forming the contact surface at the distal end of the spacer can be controlled by adjusting one or more process settings and/or parameters, a type of photoresist material used, and combinations thereof. For example, process settings and parameters including, without limitation, a mask design, a height of the mask with respect to the photoresist material, an intensity of the ultraviolet light, an exposure time to the ultraviolet light, a bake temperature and/or a bake time during the curing process, a development solution and/or a development time used during the development process, a type of photoresist material and/or process (e.g., a negative or positive photoresist process, a type of initiator used in the photoresist material, and a rate of cross-linking in the photoresist material during the curing process), and combinations thereof, can be controllably adjusted to achieve the desired surface features on the contact surface of the pixel wall and the contact surface of the spacer.

Figure 13:
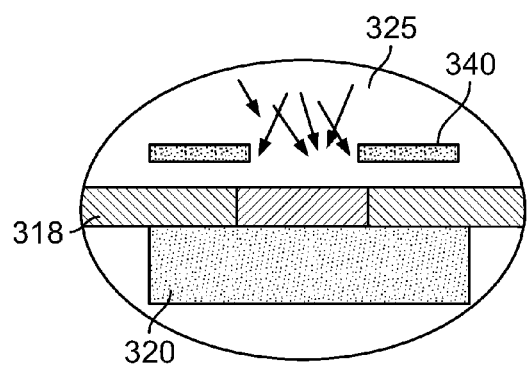
Figure 14:
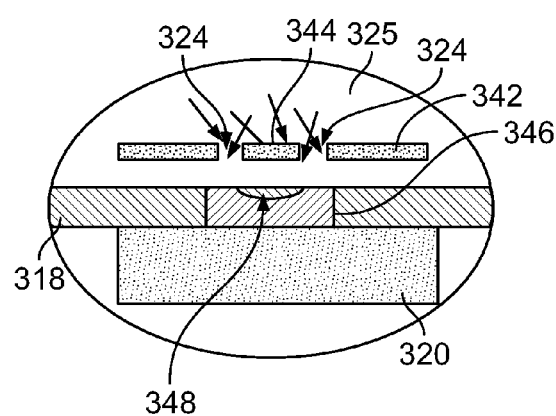

For example, referring to FIGS. 13 and 14, in certain embodiments different masks, a first mask 340, shown in FIG. 13, and a second mask 342, shown in FIG. 14, can be used in the fabrication process to control patterning of the photoresist material using the diffractive mask to cure a portion of the photoresist material. As shown in FIG. 14, a center portion 344 of diffractive mask 342 is positioned over a portion of the distal end 346 of the pixel wall to limit exposure of the portion of the distal end 346 of the pixel wall to ultraviolet light during the patterning process. As the patterned photoresist layer is developed, a concave contact surface 348 is formed on the distal end of the pixel wall.

Figure 15:
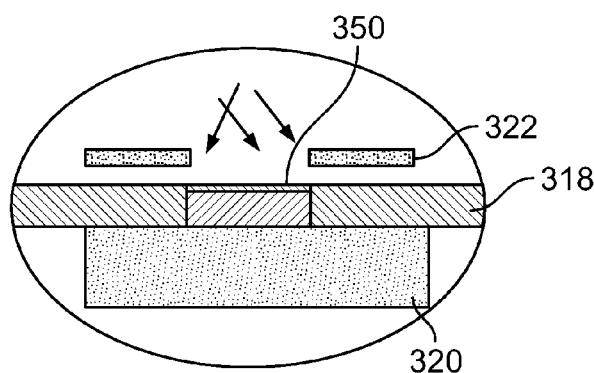
Figure 16:
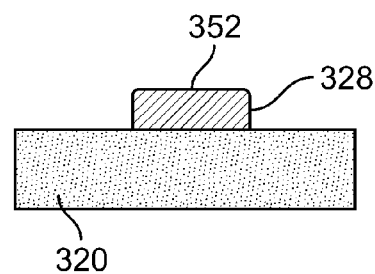

Referring to FIGS. 15 and 16, in alternative embodiments, the patterning of the photoresist material can be controlled to form a convex contact surface on the distal end of the pixel wall after the patterned photoresist layer is developed. In this embodiment, one or more of an ultraviolet light intensity and an ultraviolet exposure time can be adjusted to form a cured top layer 350 having a predetermined thickness on photoresist material 318, as shown in FIG. 15. The patterned photoresist layer is then developed to form a convex contact surface 352 on the distal end of pixel wall 328, as shown in FIG. 16. Similar processes can be used to form either a concave contact surface or a convex contact surface on the distal end of the spacer, depending on the surface feature of the distal end of the pixel wall.

Figure 17:
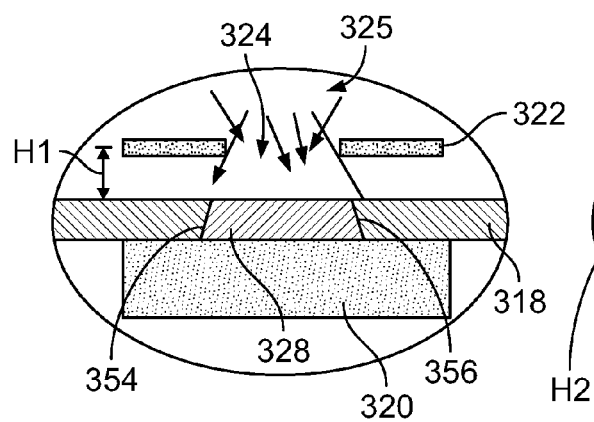
Figure 18:
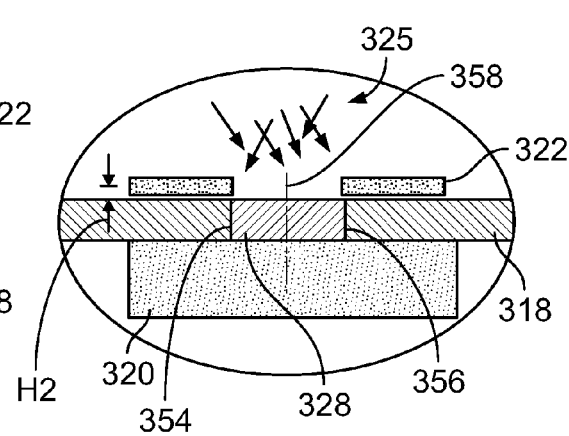

Referring now to FIGS. 17 and 18, in certain embodiments, a height position of diffractive mask 322 with respect to photoresist material 318 can be adjusted to limit exposure of an area of photoresist material 318 to ultraviolet light 325. Referring first to FIG. 17, with diffractive masked 322 positioned at a relatively higher height position, H1, with respect to photoresist material 318, rays of ultraviolet light 325 can pass through openings 324 formed in diffractive mask 322 at various angles such that portions of photoresist material 318 positioned under the non-transparent material of diffractive mask 322 are exposed to ultraviolet light 325. As a result, after the patterned photoresist layer is developed, the formed pixel wall 328 may have sides 354, 356 that converge towards the distal end of pixel wall 328. In contrast, as shown in FIG. 18, diffractive mask 322 is positioned at a relatively lower height position, H2, with respect to photoresist material 318. At least some of the angled rays of ultraviolet light 325 are block by non-transparent material to prevent or limit passage of the angled light rays through openings 324 formed in diffractive mask 322 to prevent or limit exposure of the portions of photoresist material 318 positioned under the non-transparent material of diffractive mask 322 to ultraviolet light 325. As a result, after the patterned photoresist layer is developed, the formed pixel wall 328 may have sides 354, 356 that are generally parallel to a longitudinal axis 358 of pixel wall 328.

In certain embodiments, an initiator can be added to the photoresist material to modify a strength of cross-linking within the patterned photoresist layer, e.g., through a thickness of the patterned photoresist layer. Suitable fillers and/or other additives that affect photoresist properties may be added, e.g., by a material supplier, in certain embodiments. As shown in FIG. 19, the patterning of the photoresist material using the diffractive mask to cure a portion of the photoresist material can be controlled by the addition of the initiator to form a top layer 360 on photoresist material 318 that is relatively stronger than the remaining photoresist material due to an increase in cross-linking in top layer 360. By modifying a strength of cross-linking through a thickness of the patterned photoresist layer, the formed pixel wall 328 may have sides 362, 364 that diverge at the distal end of pixel wall 328, as shown in FIG. 20.

Referring now to FIGS. 21 and 22, during the curing process to controllably pattern the photoresist material, a bake temperature and/or a bake time can be adjusted to form a cured portion, e.g., a cured top layer 370 on an uncured portion, e.g., a bottom layer, having a predetermined thickness 372 on the distal end of the pixel wall, as shown in FIG. 21, for example. In certain embodiments, thickness 372 can be predetermined by applying a known amount of photoresist material to the first support plate, resulting in a desired thickness 372. As a result, after the patterned photoresist layer is developed, the formed pixel wall 328 may slope outwardly at a base 374 of pixel wall 328, as shown in FIG. 22.

In addition or alternatively to the process adjustments described above, one or more of an amount or a concentration of a development solution and a development time can be adjusted to form the pixel wall and/or the spacer having a desired or predetermined surface feature.

As a result of controllably patterning the photoresist material by adjusting one or more process settings and/or selections, such as described herein, for example, a plurality of pixel walls 380 can be formed on a first support plate 382 having a distal end forming a non-planar contact surface 384 having a first predefined surface feature and a plurality of cooperating spacers 386 can be formed on a second support plate 388 having a distal end forming a non-planar contact surface 390 having a second predefined surface feature complementary to the first surface feature, as shown in FIG. 23.

Following formation of the pixel walls, a reflow process may be utilized to modify the hydrophobicity of the hydrophobic layer before an ultraviolet (UV) ozone process is utilized to make the pixel walls hydrophilic. The dosing used during the UV ozone processing is determined by the shape and size of the pixel walls. After UV ozone processing, the first and second liquids (e.g., the oil and electrolyte solution) can be disposed within the electrowetting pixel regions of the electrowetting display device.

Figure 24:
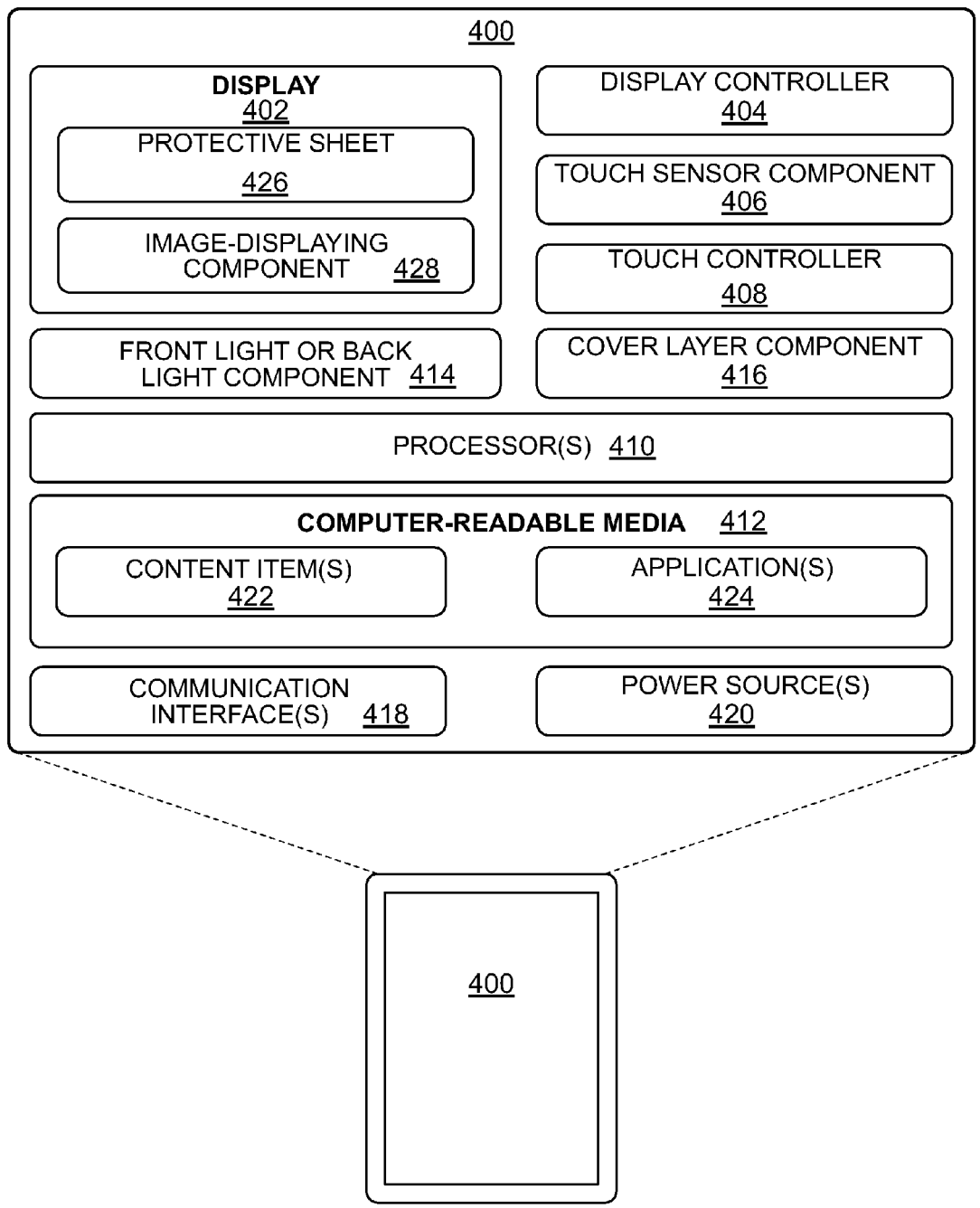
FIG. 24 shows an example electrowetting display device that may incorporate an electrowetting display, according to various embodiments.

FIG. 24 illustrates an example electrowetting display device 400 that may incorporate any of the display devices discussed above. Electrowetting display device 400 may comprise any type of electronic device having a display. For instance, electrowetting display device 400 may be a mobile electronic device (e.g., an electronic book reader, a tablet computing device, a laptop computer, a smart phone or other multifunction communication device, a portable digital assistant, a wearable computing device, or an automotive display). Alternatively, electrowetting display device 400 may be a non-mobile electronic device (e.g., a computer display or a television). In addition, while FIG. 24 illustrates several example components of electrowetting display device 400, it is to be appreciated that electrowetting display device 400 may also include other conventional components, such as an operating system, system busses, input/output components, and the like. Further, in other embodiments, such as in the case of a television or computer monitor, electrowetting display device 400 may only include a subset of the components illustrated.

Regardless of the specific implementation of electrowetting display device 400, electrowetting display device 400 includes a display 402 and a corresponding display controller 404. The display 402 may represent a reflective or transmissive display in some instances or, alternatively, a transflective display (partially transmissive and partially reflective).

In one embodiment, display 402 comprises an electrowetting display that employs an applied voltage to change the surface tension of a fluid in relation to a surface. For example, such an electrowetting display may include the array of pixel regions 101 illustrated in FIG. 1A, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, display 402 may represent a backlit display, examples of which are mentioned above.

In addition to including display 402, FIG. 24 illustrates that some examples of electrowetting display device 400 may include a touch sensor component 406 and a touch controller 408. In some instances, at least one touch sensor component 406 resides with, or is stacked on, display 402 to form a touch-sensitive display. Thus, display 402 may be capable of both accepting user touch input and rendering content in response to or corresponding to the touch input. As several examples, touch sensor component 406 may comprise a capacitive touch sensor, a force sensitive resistance (FSR), an interpolating force sensitive resistance (IFSR) sensor, or any other type of touch sensor. In some instances, touch sensor component 406 is capable of detecting touches as well as determining an amount of pressure or force of these touches.

FIG. 24 further illustrates that electrowetting display device 400 may include one or more processors 410 and one or more computer-readable media 412, as well as a front light component 414 (which may alternatively be a backlight component in the case of a backlit display) for lighting display 402, a cover layer component 416, such as a cover glass or cover sheet, one or more communication interfaces 418 and one or more power sources 420. The communication interfaces 418 may support both wired and wireless connection to various networks, such as cellular networks, radio, WiFi networks, short range networks (e.g., Bluetooth®), and infrared (IR) networks, for example.

Depending on the configuration of electrowetting display device 400, computer-readable media 412 (and other computer-readable media described throughout) is an example of computer storage media and may include volatile and nonvolatile memory. Thus, computer-readable media 412 may include, without limitation, RAM, ROM, EEPROM, flash memory, and/or other memory technology, and/or any other suitable medium that may be used to store computer-readable instructions, programs, applications, media items, and/or data which may be accessed by electrowetting display device 400.

Computer-readable media 412 may be used to store any number of functional components that are executable on processor 410, as well as content items 422 and applications 424. Thus, computer-readable media 412 may include an operating system and a storage database to store one or more content items 422, such as eBooks, audio books, songs, videos, still images, and the like. Computer-readable media 412 of electrowetting display device 400 may also store one or more content presentation applications to render content items on electrowetting display device 400. These content presentation applications may be implemented as various applications 424 depending upon content items 422. For instance, the content presentation application may be an electronic book reader application for rending textual electronic books, an audio player for playing audio books or songs, or a video player for playing video.

In some instances, electrowetting display device 400 may couple to a cover (not illustrated in FIG. 24) to protect the display 402 (and other components in the display stack or display assembly) of electrowetting display device 400. In one example, the cover may include a back flap that covers a back portion of electrowetting display device 400 and a front flap that covers display 402 and the other components in the stack. Electrowetting display device 400 and/or the cover may include a sensor (e.g., a Hall effect sensor) to detect whether the cover is open (i.e., if the front flap is not atop display 402 and other components). The sensor may send a signal to front light component 414 if the cover is open and, in response, front light component 414 may illuminate display 402. If the cover is closed, meanwhile, front light component 414 may receive a signal indicating that the cover has closed and, in response, front light component 414 may turn off.

Furthermore, the amount of light emitted by front light component 414 may vary. For instance, upon a user opening the cover, the light from the front light may gradually increase to its full illumination. In some instances, electrowetting display device 400 includes an ambient light sensor (not illustrated in FIG. 24) and the amount of illumination of front light component 414 may be based at least in part on the amount of ambient light detected by the ambient light sensor. For example, front light component 414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 402 may vary depending on whether front light component 414 is on or off, or based on the amount of light provided by front light component 414. For instance, electrowetting display device 400 may implement a larger default font or a greater contrast when the light is off compared to when the light is on. In some embodiments, electrowetting display device 400 maintains, if the light is on, a contrast ratio for display 402 that is within a certain defined percentage of the contrast ratio if the light is off.

As described above, touch sensor component 406 may comprise a capacitive touch sensor that resides atop display 402. In some examples, touch sensor component 406 may be formed on or integrated with cover layer component 416. In other examples, touch sensor component 406 may be a separate component in the stack of the display assembly. Front light component 414 may reside atop or below touch sensor component 406. In some instances, either touch sensor component 406 or front light component 414 is coupled to a top surface of a protective sheet 426 of display 402. As one example, front light component 414 may include a lightguide sheet and a light source (not illustrated in FIG. 24). The lightguide sheet may comprise a substrate (e.g., a transparent thermoplastic such as PMMA or other acrylic), a layer of lacquer and multiple grating elements formed in the layer of lacquer that function to propagate light from the light source towards display 402; thus, illuminating display 402.

Cover layer component 416 may include a transparent substrate or sheet having an outer layer that functions to reduce at least one of glare or reflection of ambient light incident on electrowetting display device 400. In some instances, cover layer component 416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3 h pencil). Without such scratch resistance, a device may be more easily scratched and a user may perceive the scratches from the light that is dispersed over the top of the reflective display. In some examples, protective sheet 426 may include a similar UV-cured hard coating on the outer surface. Cover layer component 416 may couple to another component or to protective sheet 426 of display 402. Cover layer component 416 may, in some instances, also include a UV filter, a UV-absorbing dye, or the like, for protecting components lower in the stack from UV light incident on electrowetting display device 400. In still other examples, cover layer component 416 may include a sheet of high-strength glass having an antiglare and/or antireflective coating.

Display 402 includes protective sheet 426 overlying an image-displaying component 428. For example, display 402 may be preassembled to have protective sheet 426 as an outer surface on the upper or image-viewing side of display 402. Accordingly, protective sheet 426 may be integral with and may overlay image-displaying component 428. Protective sheet 426 may be optically transparent to enable a user to view, through protective sheet 426, an image presented on image-displaying component 428 of display 402.

In some examples, protective sheet 426 may be a transparent polymer film in the range of 25 to 200 micrometers in thickness. As several examples, protective sheet 426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 426 may include a coating, such as the hard coating described above. For instance, the hard coating may be applied to the outer surface of protective sheet 426 before or after assembly of protective sheet 426 with image-displaying component 428 of display 402. In some examples, the hard coating may include a photoinitiator or other reactive species in its composition, such as for curing the hard coating on protective sheet 426. Furthermore, in some examples, protective sheet 426 may be dyed with a UV-light-absorbing dye, or may be treated with other UV-absorbing treatment. For example, protective sheet 426 may be treated to have a specified UV cutoff such that UV light below a cutoff or threshold wavelength is at least partially absorbed by protective sheet 426, thereby protecting image-displaying component 428 from UV light.

According to some embodiments herein, one or more of the components discussed above may be coupled to display 402 using fluid optically-clear adhesive (LOCA). For example, the light guide portion of front light component 414 may be coupled to display 402 by placing LOCA on the outer or upper surface of protective sheet 426. If the LOCA reaches the corner(s) and/or at least a portion of the perimeter of protective sheet 426, UV-curing may be performed on the LOCA at the corners and/or the portion of the perimeter. Thereafter, the remaining LOCA may be UV-cured and front light component 414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 414. In other embodiments, the LOCA may be placed near a center of protective sheet 426, and pressed outwards towards a perimeter of the top surface of protective sheet 426 by placing front light component 414 on top of the LOCA. The LOCA may then be cured by directing UV light through front light component 414. As discussed above, and as discussed additionally below, various techniques, such as surface treatment of the protective sheet, may be used to prevent discoloration of the LOCA and/or protective sheet 426.

While FIG. 24 illustrates a few example components, electrowetting display device 400 may have additional features or functionality. For example, electrowetting display device 400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electrowetting display device 400 may reside remotely from electrowetting display device 400 in some implementations. In these implementations, electrowetting display device 400 may utilize communication interfaces 418 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
   a first support plate and an opposing second support plate;
   a first fluid and a second fluid that is immiscible with the first fluid, the first fluid and the second fluid disposed between the first support plate and the second support plate;
   a pixel wall portion formed on the first support plate, the pixel wall portion at least partially forming a perimeter of an electrowetting pixel, the pixel wall portion having an end with a non-planar contact surface extending a width of the pixel wall portion between a first sidewall of the pixel wall portion and an opposing second sidewall of the pixel wall portion; and
   a spacer coupled to the second support plate, the spacer having an end with a non-planar contact surface extending a width of the spacer between a first sidewall of the spacer and an opposing second sidewall of the spacer and substantially contacting the non-planar contact surface of the pixel wall portion.

2. The electrowetting display device of claim 1, wherein the contact surface of the pixel wall portion is concave with respect to a plane extending along a width of the pixel wall portion perpendicular to a longitudinal centerline of the pixel wall portion and the contact surface of the spacer is convex with respect to the plane.

3. The electrowetting display device of claim 1, wherein, with the contact surface of the pixel wall portion substantially contacting the contact surface of the spacer, a longitudinal centerline of the pixel wall portion is coaxially aligned with a longitudinal centerline of the spacer.

4. A display device, comprising:
   a first support plate and an opposing second support plate;
   a wall on the first support plate, at least a portion of the wall associated with a pixel, an end of the wall portion with a non-planar contact surface extending a width of the wall portion between a first sidewall of the wall portion and an opposing second sidewall of the wall portion and having a first surface feature; and
   a spacer on the second support plate and extending toward the wall portion, the spacer having an end with a non-planar contact surface extending a width of the spacer between a first sidewall of the spacer and an opposing second sidewall of the spacer and having a second surface feature, the non-planar contact surface of the spacer substantially contacting the non-planar contact surface of the wall portion.

5. The display device of claim 4, wherein the first surface feature provides a concave contact surface with respect to a plane extending along the width of the wall portion perpendicular to a longitudinal centerline of the wall portion and the second surface feature provides a convex contact surface of the spacer with respect to the plane.

6. The display device of claim 4, wherein the first surface feature provides a convex contact surface with respect to a plane extending along the width of the wall portion perpendicular to a longitudinal centerline of the wall portion and the second surface feature provides a concave contact surface with respect to the plane.

7. The display device of claim 4, wherein, with the non-planar contact surface of the wall portion substantially contacting the non-planar contact surface of the spacer, a longitudinal centerline of the wall portion is coaxially aligned with a longitudinal centerline of the spacer.

8. The display device of claim 4, wherein the first surface feature includes a first planar region at an acute angle or an obtuse angle with respect to a longitudinal centerline of the wall portion and the second surface feature includes a second planar region substantially contacting the first planar region.

9. The display device of claim 8, wherein the first surface feature includes a third planar region, the first planar region and the third planar region meeting at the longitudinal axis of the wall portion, and the second surface feature includes a fourth planar region, the second planar region and the fourth planar region meeting at a longitudinal axis of the spacer coaxial with the longitudinal axis of the wall portion, wherein the fourth planar region substantially contacts the third planar region.

10. The display device of claim 4, wherein the first surface feature comprises a projection and the second surface feature comprises a void accepting the projection.

11. The display device of claim 4, wherein a portion of the first surface feature of the wall portion is planar and a corresponding portion of the second surface feature of the spacer is planar.

12. The display device of claim 4, wherein at least a portion of the first surface feature of the wall portion is arcuate and a corresponding portion of the second surface feature of the spacer is arcuate.

13. A method for fabricating at least a portion of an electrowetting display device, the method comprising:
    applying a photoresist material over a surface of a first support plate;
    positioning a diffractive mask over the first support plate, the diffractive mask including a pattern of non-transparent material defining one or more openings through the diffractive mask;
    controllably exposing the photoresist material to ultraviolet light through the one or more openings to cure a portion of the photoresist material to form a patterned photoresist layer;
    developing the patterned photoresist layer; and
    removing uncured portions of the photoresist material to form a pixel wall portion having an end with a non-planar contact surface having a first surface feature.

14. The method of claim 13, wherein controllably exposing the photoresist material to ultraviolet light through the one or more openings to cure a portion of the photoresist material to form a patterned photoresist layer comprises:
    positioning a portion of the diffractive mask over a portion of the end of the pixel wall portion to limit exposure of the portion of the end of the pixel wall portion to ultraviolet light; and
    developing the end of the pixel wall portion to form a concave contact surface.

15. The method of claim 13, wherein controllably exposing the photoresist material to ultraviolet light through the one or more openings to cure a portion of the photoresist material to form a patterned photoresist layer comprises:
    adjusting one or more of an ultraviolet light intensity and an ultraviolet exposure time to form a cured top layer having a predetermined thickness on the end of the pixel wall portion; and
    developing the end of the pixel wall portion to form a convex contact surface.

16. The method of claim 13, wherein controllably exposing the photoresist material to ultraviolet light through the one or more openings to cure a portion of the photoresist material to form a patterned photoresist layer comprises:
    adjusting a height position of the diffractive mask with respect to the photoresist material to limit exposure of an area of the photoresist material to ultraviolet light.

17. The method of claim 13, wherein controllably exposing the photoresist material to ultraviolet light through the one or more openings to cure a portion of the photoresist material to form a patterned photoresist layer comprises:
    adjusting one or more of a bake temperature and a bake time to form a cured portion having a predetermined thickness on the end of the pixel wall portion.

18. The method of claim 13, wherein developing the patterned photoresist layer comprises:
    adjusting one or more of a concentration of a development solution and a development time.

19. The method of claim 13, further comprising:
    depositing a photoresist material over a surface of a second support plate;
    positioning a diffractive mask over the second support plate, the diffractive mask including a pattern of non-transparent material defining one or more openings through the diffractive mask;
    controllably exposing the photoresist material to ultraviolet light through the one or more openings to cure a portion of the photoresist material to form a patterned photoresist layer; and
    developing the patterned photoresist layer to form a spacer having an end with a non-planar contact surface having a second surface feature complementary to the first surface feature.

20. The method of claim 19, further comprising:
    aligning the end of the spacer to contact the end of the pixel wall portion to at least partially define an electrowetting pixel; and
    coupling the second support plate to the first support plate.

* * * * *